(12) United States Patent
Li et al.

(10) Patent No.: US 10,430,333 B2
(45) Date of Patent: Oct. 1, 2019

(54) STORAGE SYSTEM WITH INTERCONNECTED SOLID STATE DISKS

(71) Applicant: Intel Corporation, Santa Clara, CA (US)

(72) Inventors: Peng Li, Beaverton, OR (US); Jawad B. Khan, Portland, OR (US); Sanjeev N. Trika, Portland, OR (US)

(*) Notice: Subject to any disclaimer, the term of this patent is extended or adjusted under 35 U.S.C. 154(b) by 64 days.

(21) Appl. No.: 15/721,547

(22) Filed: Sep. 29, 2017

(65) Prior Publication Data

US 2019/0102293 A1    Apr. 4, 2019

(51) Int. Cl.
*G06F 12/06* (2006.01)
*G11C 7/10* (2006.01)
*G05B 19/045* (2006.01)

(52) U.S. Cl.
CPC ....... *G06F 12/0692* (2013.01); *G05B 19/045* (2013.01); *G11C 7/1006* (2013.01)

(58) Field of Classification Search
CPC ... G06F 12/0642; G06F 12/0692; G11C 5/06; G05B 19/045
See application file for complete search history.

(56) References Cited

U.S. PATENT DOCUMENTS

| | | | |
|---|---|---|---|
| 9,936,024 B2* | 4/2018 | Malwankar | H04L 67/2842 |
| 2005/0246494 A1* | 11/2005 | Leon, Jr. | G06F 3/0626 |
| | | | 711/115 |
| 2011/0040949 A1* | 2/2011 | Hoese | G06F 13/1668 |
| | | | 711/172 |
| 2012/0030414 A1* | 2/2012 | Jo | G06F 13/1673 |
| | | | 711/103 |
| 2013/0086336 A1* | 4/2013 | Canepa | G06F 3/0683 |
| | | | 711/154 |
| 2014/0089585 A1* | 3/2014 | Nakajima | G06F 13/1663 |
| | | | 711/118 |
| 2014/0129753 A1* | 5/2014 | Schuette | G06F 13/4068 |
| | | | 710/301 |
| 2015/0324118 A1* | 11/2015 | McCambridge | G06F 3/0613 |
| | | | 710/5 |
| 2016/0098227 A1* | 4/2016 | Bandic | G06F 16/1847 |
| | | | 711/103 |
| 2017/0262029 A1* | 9/2017 | Nelson | G06F 1/20 |
| 2017/0277545 A1* | 9/2017 | Dambal | G06F 9/4403 |
| 2018/0095674 A1* | 4/2018 | Alameldeen | G06F 3/0608 |
| 2019/0005606 A1* | 1/2019 | Yang | G06T 1/60 |

OTHER PUBLICATIONS

U.S. Appl. No. 15/068,827, "Data Storage System with Parallel Array of Dense Memory Cards and High Airflow," filed Mar. 14, 2016, 27 pages.

* cited by examiner

*Primary Examiner* — Glenn A. Auve
(74) *Attorney, Agent, or Firm* — Jordan IP Law, LLC

(57) ABSTRACT

An embodiment of a semiconductor package apparatus may include technology to provide a first interface between a first storage device and a host device, and provide a second interface directly between the first storage device and a second storage device. Other embodiments are disclosed and claimed.

24 Claims, 10 Drawing Sheets

| SSD ID | West Connection | East Connection |
|--------|-----------------|-----------------|
| 0 | 31 | 1 |
| 1 | 0 | 2 |
| 2 | 1 | 3 |
| 3 | 2 | |
| … … | … … | … … |
| 31 | 30 | 0 |

| Start LBA | Opcode (Read Single SSD Connection) |

FIG. 9

| Start LBA | Opcode (Write SSD Connection Routing Table) |

FIG. 10

| Source SSD ID | Start LBA | Delete Flag |
|---|---|---|
| Target SSD ID | Start LBA | N/A |
| Number of LBAs to transfer | Opcode (SSD-to-SSD Data movement) | |

FIG. 11

| Source SSD ID | Start LBA | Delete Flag |
|---|---|---|
| 0 | 1000 | Do NOT Delete |
| 6 | 2000 | N/A |
| 2^20 | Opcode (SSD-to-SSD Data movement) | |

FIG. 14

STORAGE SYSTEM WITH INTERCONNECTED SOLID STATE DISKS

TECHNICAL FIELD

Embodiments generally relate to storage technology, and more particularly embodiments relate to a storage system with interconnected solid state disks.

BACKGROUND

Electronic systems may include a number of storage devices. In particular, a server system may include multiple storage devices plugged into a rack mountable enclosure.

BRIEF DESCRIPTION OF THE DRAWINGS

The various advantages of the embodiments will become apparent to one skilled in the art by reading the following specification and appended claims, and by referencing the following drawings, in which:

FIG. 9 is an illustrative diagram of an example of a host command according to an embodiment;

FIG. 10 is an illustrative diagram of another example of a host command according to an embodiment;

FIG. 11 is an illustrative diagram of another example of a host command according to an embodiment;

FIG. 14 is an illustrative diagram of another example of a host command according to an embodiment.

DESCRIPTION OF EMBODIMENTS

Various embodiments described herein may include a memory component and/or an interface to a memory component. Such memory components may include volatile and/or nonvolatile memory. Nonvolatile memory may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at jedec.org).

Volatile memory may be a storage medium that requires power to maintain the state of data stored by the medium. Non-limiting examples of volatile memory may include various types of RAM, such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

Figure 1:
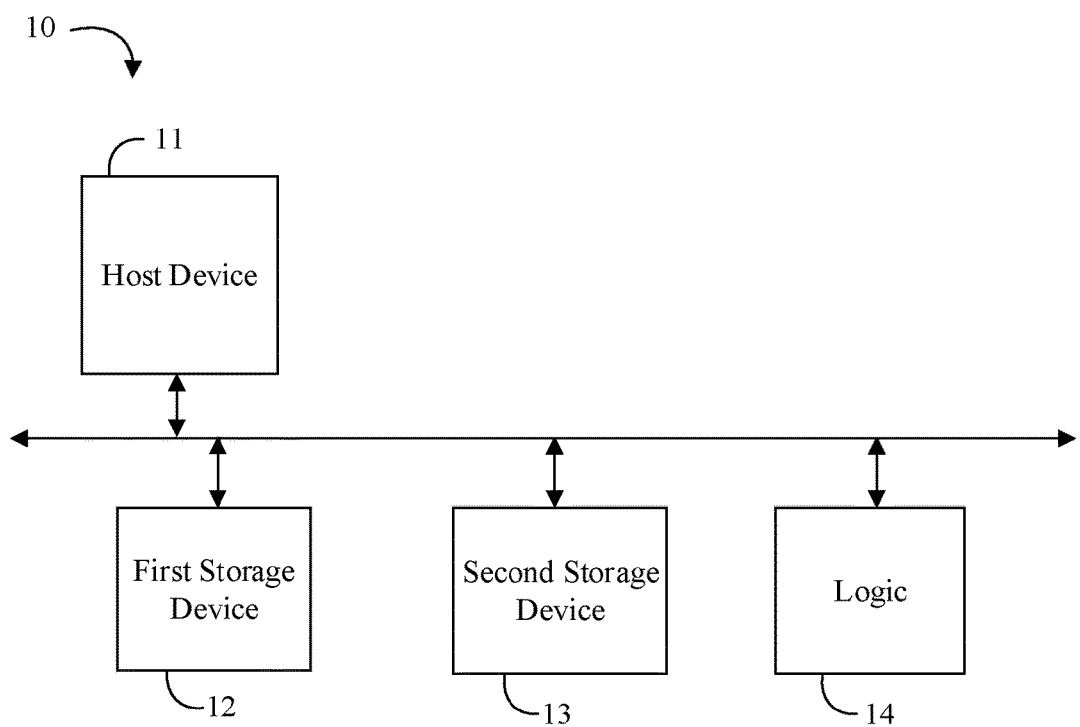
FIG. 1 is a block diagram of an example of an electronic processing system according to an embodiment.

Turning now to FIG. 1, an embodiment of an electronic processing system 10 may include a host device 11 having a chassis, a first storage device 12 communicatively coupled to the host device 11 inside the chassis, a second storage device 13 communicatively coupled to the host device 11 inside the chassis, and logic 14 communicatively coupled to the first storage device 12 to provide a first interface between the first storage device 12 and the host device 11, and provide a second interface directly between the first storage device 12 and the second storage device 13. For example, the logic 14 may be configured to provide a peer-to-peer interface for the second interface. In some embodiments, the logic 14 may be further configured to provide a third peer-to-peer interface between the first storage device 12 and a third storage device communicatively coupled to the host device 11 inside the chassis. For example, the logic 14 may also be configured to discover one or more storage devices interconnected with the first storage device 12, and update a local routing table for the first storage device 12 based on the discovered interconnected storage devices. In some embodiments, the logic 14 may be further configured to process a data movement command to one or more of move and copy data between two or more of the interconnected storage devices. In any of the embodiments herein, one or more of the storage devices may include a solid-state disk (SSD) device. For example, the storage devices may implement or be part of an all-flash array (AFA) storage system.

Embodiments of each of the above host device 11, first storage device 12, second storage device 13, logic 14, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the first storage device 12, second storage device 13, host memory, persistent storage media, or other system memory may store a set of instructions which when executed by a processor cause the system 10 to implement one or more components, features, or aspects of the system 10 (e.g., the logic 14, providing the interface between the storage devices and the host device, and providing the respective interfaces directly between the interconnected storage devices, etc.).

Figure 2:
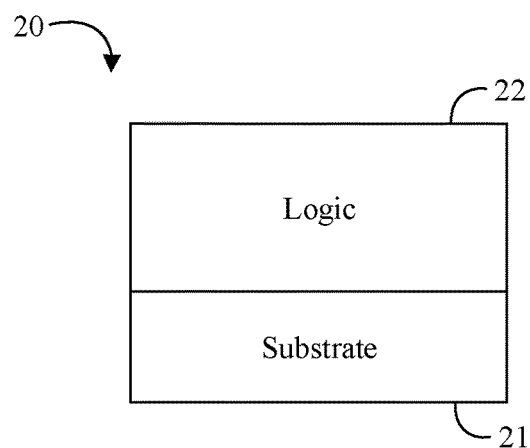
FIG. 2 is a block diagram of an example of a semiconductor package apparatus according to an embodiment.

Turning now to FIG. 2, an embodiment of a semiconductor package apparatus 20 may include a substrate 21, and logic 22 coupled to the substrate 21, wherein the logic 22 may be at least partly implemented in one or more of configurable logic and fixed-functionality hardware logic. The logic 22 coupled to the substrate 21 may be configured to provide a first interface between a first storage device and a host device, and provide a second interface directly between the first storage device and a second storage device. For example, the logic 22 may be configured to provide a peer-to-peer interface for the second interface. In some embodiments, the logic 22 may be further configured to provide a third peer-to-peer interface between the first storage device and a third storage device. For example, the logic 22 may also be configured to discover one or more storage devices interconnected with the first storage device, and update a local routing table for the first storage device based on the discovered interconnected storage devices. In some embodiments, the logic 22 may be further configured to process a data movement command to one or more of move and copy data between two or more of the interconnected storage devices. For example, one or more of the storage devices may include a SSD device.

Embodiments of logic 22, and other components of the apparatus 20, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

Figure 3A:
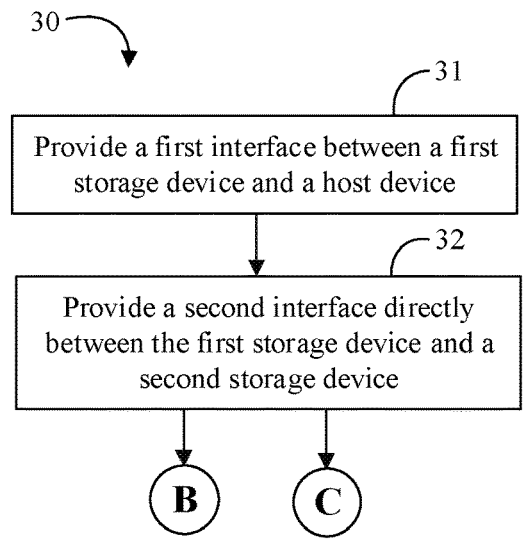
FIGS. 3A to 3C are flowcharts of an example of a method of interconnecting storage device according to an embodiment.
Figure 3B:
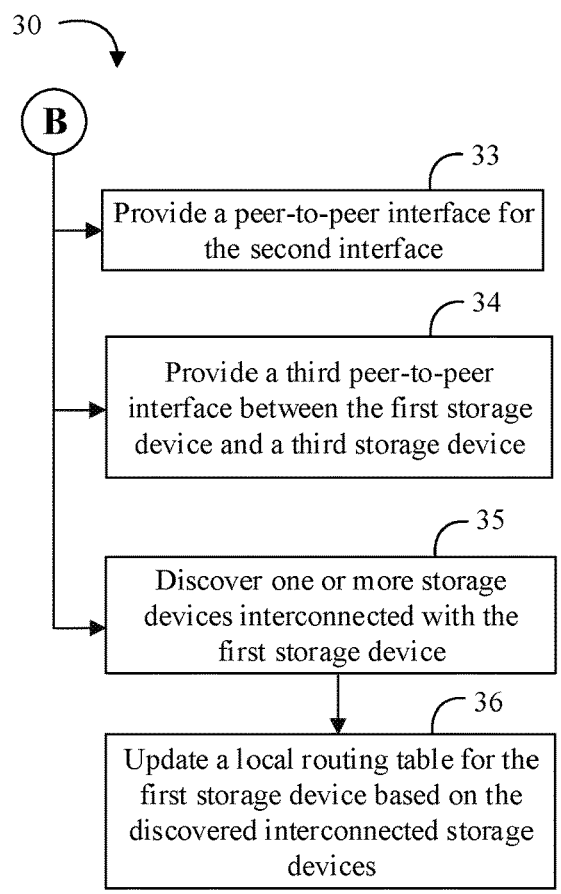
Figure 3C:
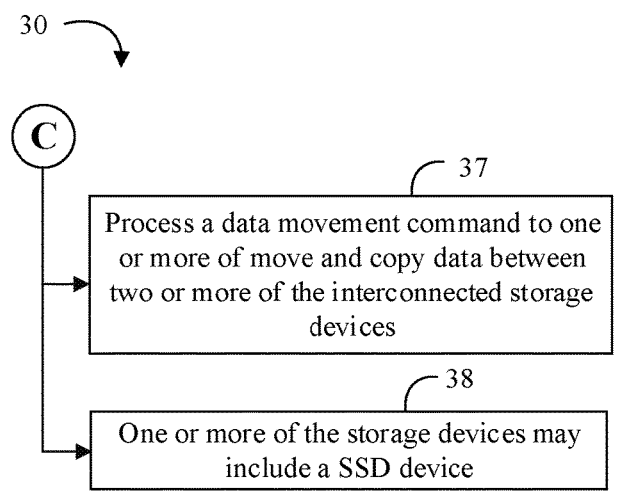

Turning now to FIGS. 3A to 3C, an embodiment of a method 30 of interconnecting storage devices may include providing a first interface between a first storage device and a host device at block 31, and providing a second interface directly between the first storage device and a second storage device at block 32. For example, the method 30 may include providing a peer-to-peer interface for the second interface at block 33. Some embodiments of the method 30 may further include providing a third peer-to-peer interface between the first storage device and a third storage device at block 34. For example, some embodiments may include discovering one or more storage devices interconnected with the first storage device at block 35, and updating a local routing table for the first storage device based on the discovered interconnected storage devices at block 36. Some embodiments may further include processing a data movement command to one or more of move and copy data between two or more of the interconnected storage devices at block 37. For example, one or more of the storage devices may include a SSD device at block 38.

Embodiments of the method 30 may be implemented in a system, apparatus, computer, device, server, etc., for example, such as those described herein. More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the method 30 may be implemented on a computer readable medium as described in connection with Examples 19 to 24 below. Embodiments or portions of the method 30 may be implemented in firmware, applications (e.g., through an application programming interface (API)), or driver software running on an operating system (OS).

Figure 4:
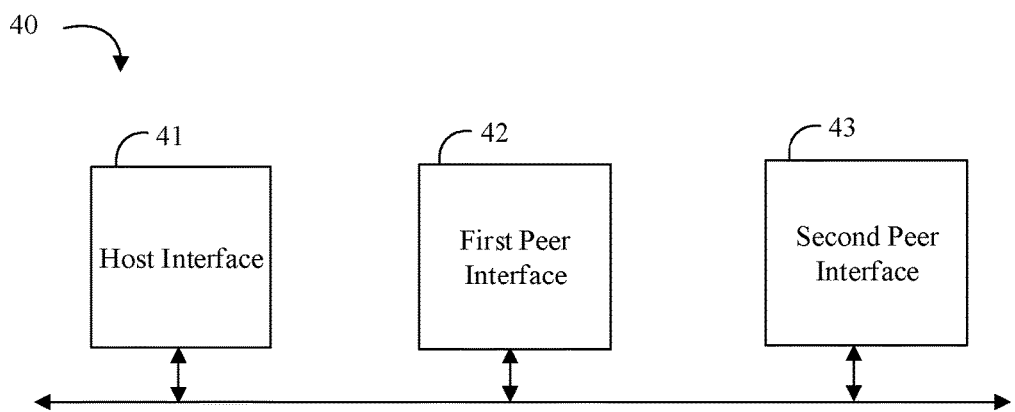
FIG. 4 is a block diagram of an example of an interface controller apparatus according to an embodiment.

Turning now to FIG. 4, some embodiments may be logically or physically arranged as one or more modules. For example, an embodiment of a storage controller 40 may include a host interface 41, a first peer interface 42, and a second peer interface 43. The host interface 41 may provide an interface between a first storage device and a host device. The first peer interface 42 may provide an interface directly between the first storage device and a second storage device. For example, the first peer interface may be configured to provide a peer-to-peer interface between the first storage device and the second storage device. The second peer interface may provide a peer-to-peer interface between the first storage device and a third storage device. For example, the storage controller 40 may also be configured to discover one or more storage devices interconnected with the first storage device, and update a local routing table for the first storage device based on the discovered interconnected storage devices. In some embodiments, the storage controller 40 may be further configured to process a data movement command to one or more of move and copy data between two or more of the interconnected storage devices. For example, one or more of the storage devices may include a SSD device.

Embodiments of the host interface 41, the first peer interface 42, the second peer interface 43, and other components of the storage controller 40, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

Some embodiments may advantageously provide a storage system with inter-SSD paths. For example, some embodiments may provide peer-to-peer communication among several SSDs in a disaggregated storage appliance system such as rack-mountable multi-slot storage unit for a server. In some embodiments, inter-SSD physical data-paths may be provided such that each SSD may be be connected not only to the host but also to its neighboring peers as well. In some embodiments, the interface to the host may be referred to as a north interface, the interface to the neighboring peer on the right (e.g., relative to the location of the physical host connection) may be referred to as an east interface, and the interface to the neighboring peer on the left may be referred to as a west interface. These non-limiting designations are nominal and only used for the purpose of convenience and distinguishing between multiple interfaces on the storage device.

Figure 5:
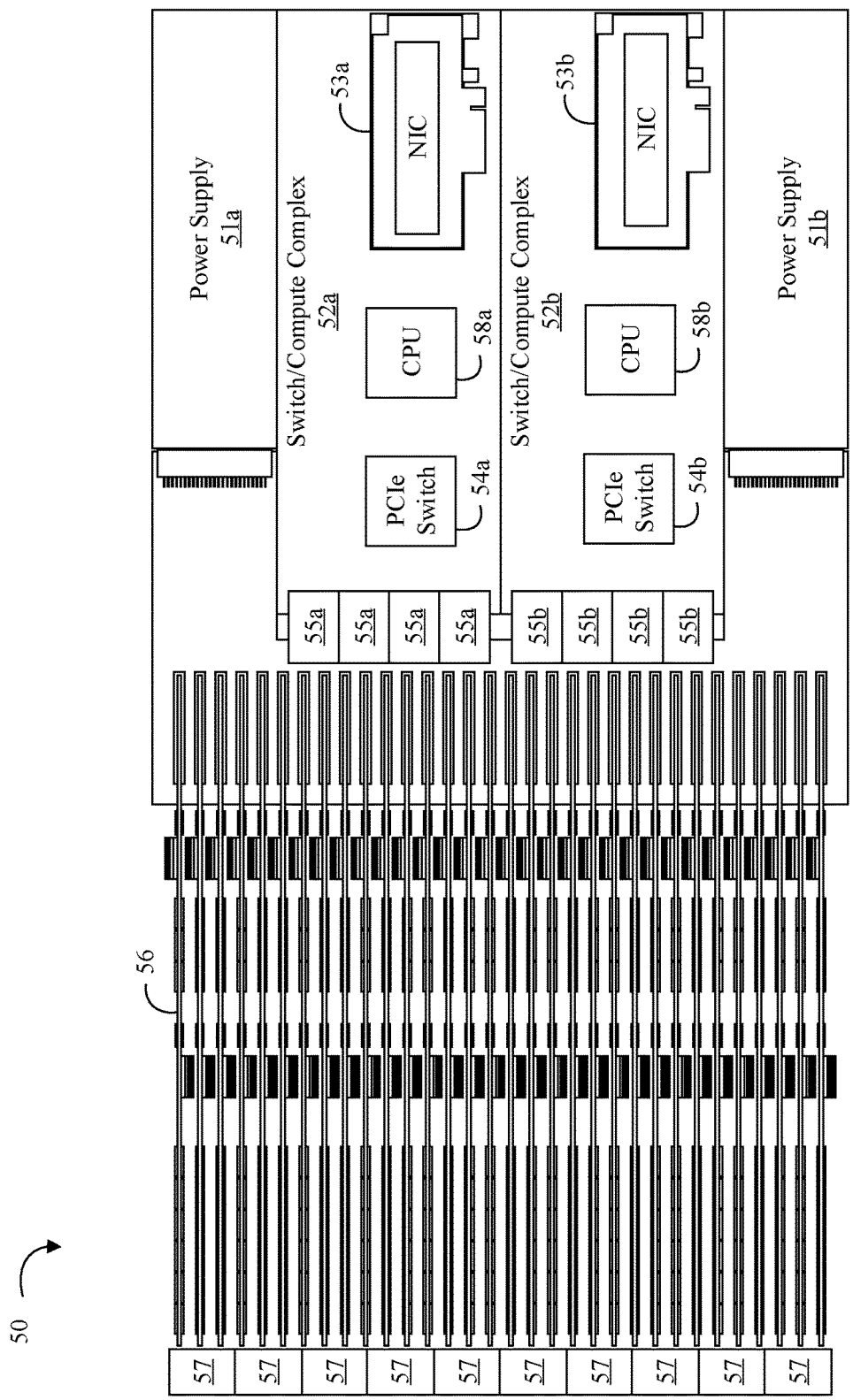
FIG. 5 is an illustrative top view of an example of a storage system according to an embodiment.

Turning now to FIG. 5, a storage system 50 may include a rack-mountable module which houses power supplies 51a and 51b, and switch compute complexes 52a and 52b with respective central processor units (CPUs) 58a and 58b, respective network interface cards (NICs) 53a and 53b, and respective Peripheral Component Interconnect Express (PCIe) switches 54a and 54b. For example, the power supplies 51a and 51b may each be a 1600 W replaceable module. For example, the switch/compute complexes 52a and 52b may each provide I/O routing and connectors in an interchangeable module. The switch/compute complexes 52a and 52b may further include respective connectors 55a and 55b to provide 48 differential pair connections and also miscellaneous signal and power connections. Up to 32 "ruler" form factor SSD (RSSD) devices 56 may be positioned in respective slots of the storage system 50. For example, the RSSD devices 56 may be long, thin modules physically sized similar to a 12-inch ruler. The storage system 50 may further include multiple fans 57 to provide cooling for the system 50.

Some embodiments of the system 50 may provide a disaggregated storage system having network connectivity at the back along with redundant compute resources and PCIe switches for attaching up to 32 RSSDs in the front. A host device may be attached to the storage system 50 and the host may use the storage system 50 as a very large SSD (e.g., 1 petabyte (PB) or more). In some embodiments, all of the RSSDs may be aggregated in terms of capacity and may be presented to the host as single device. The storage system 50 may provide high storage density (e.g., 1 PB in a one unit (1 U) rack mountable component) and lower total cost of ownership (TCO).

Each RSSD may be connected to the CPUs in the host via a PCIe switch. In some other systems, the data may be sent to the host and then may make its way back to storage. Some applications may need to or may benefit from moving data within the storage system 50. A problem with some other systems is that the host must get involved with the data movement. For example, in some other systems the data movement may involve first reading the data from the source SSD to the host memory, and then writing the data from the host memory to the target SSD. This approach may have one or more problems including, for example, consuming frontend interface bandwidth, consuming host memory, and/or increasing latency with host-supported data movement operations. Some embodiments may advantageously provide efficient peer-to-peer data movement within a disaggregated storage system such as the system 50. Some embodiments may improve or optimize the data paths within the storage system 50 such that the system 50 may be used more efficiently for a certain class of applications (e.g., which need or benefit from internal peer-to-peer connectivity). For example, distributed RAID applications, local analytics applications, and other big data applications may benefit from more data paths within a storage system in accordance with some embodiments.

Some embodiments may provide a storage system with inter-SSD data paths configured such that each SSD may have up to three physical interfaces (e.g., one interface may connect to the host via the PCIe switch, the other two interfaces may be peer-to-peer connections to the SSD's peer SSDs). Each SSD may have an internal routing table that corresponds to the SSD topology information of the storage system. In some embodiments, the host may send internal data movement commands to move/copy data among SSDs within the storage system. For example, once an SSD receives the data movement command, the SSD may use the command descriptor and the SSD's routing table to determine the corresponding action. The actions may include one or more of the following: if the SSD has the source data, the SSD may send the data and forward the command to peer target SSD(s); if the SSD is the target, the SDD may receive the data from peer SSD(s) and acknowledge completion; and, if the SSD is neither the source nor target, the SSD may forward the data/command to peer SSD(s).

Advantageously, because some embodiments provide more connectivity within a storage system, the backend bandwidth of the storage system may be effectively increased by allowing peer-to-peer transactions to occur independent of the host path. For applications that move/copy a huge amount of data within the same storage system, for example, some embodiments may improve the data throughput by utilizing the backend interface bandwidth. Advantageously, when the storage system is moving data using its backend interface, some embodiments may serve other host read/write requests using the frontend interface simultaneously and/or the host CPU and memory may be relieved and/or utilized by other applications.

Figures 6, 7:
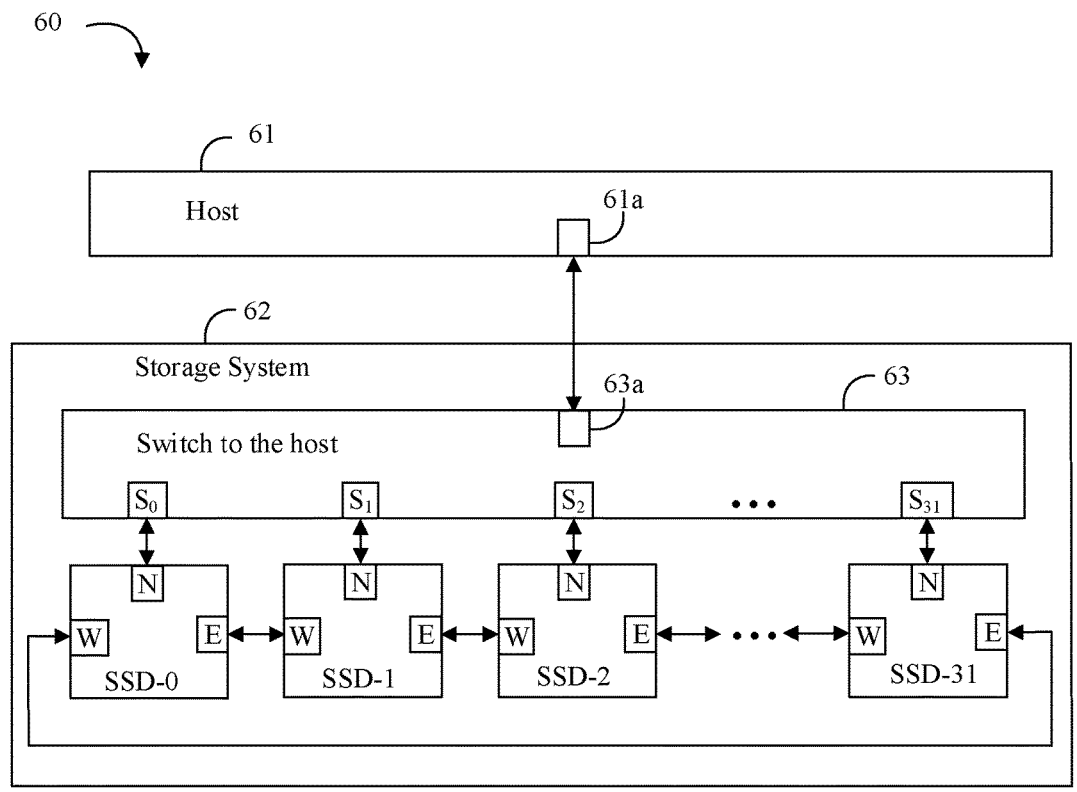
FIG. 6 is a block diagram of another example of an electronic processing system according to an embodiment.
FIG. 7 is an illustrative diagram of an example of a routing table according to an embodiment.

Turning now to FIG. 6, an embodiment of an electronic processing system 60 may include a host device 61 coupled to a storage system 62. The storage system 62 may include a switch 63 coupled between the host device 61 and two or more SSD devices SSD-0 through SSD-31. Each of the SSD devices may include respective north (N), east (E), and west (W) interfaces. The north (e.g., host) interface may connect to the switch 63, while the east and west interfaces may connect each SSD to peer SSDs. For example, SSD-0 may connect to SSD-31 and SSD-1, SSD-1 may connect to SSD-0 and SSD-2, etc.

The system 60 may use any suitable communication/storage protocol including, for example, PCIe, Non-Volatile Memory Express (NVMe), etc. For example, the host device 61 may include a PCIe interface 61a coupled to a PCIe interface 63a on the switch 63. The switch 63 may further include 32 NVMe interfaces $S_0$ through $S_{31}$ coupled to respective north NVMe interfaces on the SSD devices SSD-0 through SSD-31. The storage system 62 may further include inter-connected SSD data-paths between the SSD devices. For example, the west interface on each SSD may be coupled to the east interface on the neighboring SSD device, except for the west interface on SSD-0 which may be coupled to the east interface on the last SSD device (e.g., SSD-31) such that all of the SSD devices are interconnected with a ring topology.

In some embodiments, the east and west interfaces may also be NVMe interfaces. For example, each NVMe interface may be used to forward user data and/or NVMe commands. In some embodiments, the peer interfaces may not support the entire set of PCIe/NVMe protocols. For example, a reduced set protocol may be used to remove some unneeded protocol complexity for the peer-to-peer communication. For example, because an SSD device in the storage system 62 may always be guaranteed to be connected to a peer SSD (e.g., and not to a bridge, a switch, etc.) much of the protocol complexity may be removed, resulting in a simpler and more efficient peer-to-peer interface. Even if NVMe is used for the interface, some embodiments may implement a simpler NVMe interface. For example, two NVMe queues may suffice for the peer-to-peer communication. One queue may send information to the peer SSD, and the other queue may receive commands. In some embodiments, a two queue implementation may significantly reduce the hardware complexity of the interface. In some embodiments, native administration queues may provide for control of the functionality of the peer-to-peer connections. In some embodiments, the peer-to-peer connections may be enabled or disabled by the host (e.g., as needed).

Turning now to FIG. 7, an embodiment of a routing table may include a table entry for each storage device which includes a device identification (ID), a first peer connection, and a second peer connection. In order to more effectively communicate with each other, in some embodiments each SSD may be provided with the connectivity information for the whole system. All of the SSDs in the storage system may have the same routing table, which may contain the information of the SSD connection topology within the storage system. In some embodiments, the table entries may include an SSD ID, a west connection, and an east connection for each SSD. For the storage system 62, the routing table may include entries for each of the SSD devices SSD-0 through SSD-31 (e.g., 32 entries total). The value of the table entry for the SSD ID may be the SSD device's own ID, the value of the table entry for the west connection may be the ID of the peer SSD connected to the SSD device's west interface, and the value of the table entry for the east connection may be the ID of the peer SSD connected to the SSD device's east interface. Each SSD may the use the information in the routing table to determine a good or optimal path to forward data or/and commands to a destination SSD (e.g., using any useful data routing technique such as Dijkstra's, Bellman-Ford, etc.).

In some embodiments, the SSD devices may be hot pluggable and some devices may be removed from the system, in which case the routing table may be updated to correspond to the SSDs installed in the system. Some embodiments may provide error handling for SSD hot removal and/or failure. When a first SSD (e.g., a transmitter) sends data to a second SSD (e.g., a receiver), the transmitter may expect to receive an acknowledge message from the receiver within a given time period. If the receiver is removed from the system, or stops working, it will not send the acknowledge message to the transmitter in time. In this case, the transmitter may remove the receiver's ID from its routing table, and may then calculate the next good/optimal path for the transmission. If a suitable path is found, the transmitter may then send the commands, data, and the new routing table to a new receiver. If a suitable path is not found, an error may be returned to the host.

Figure 8:
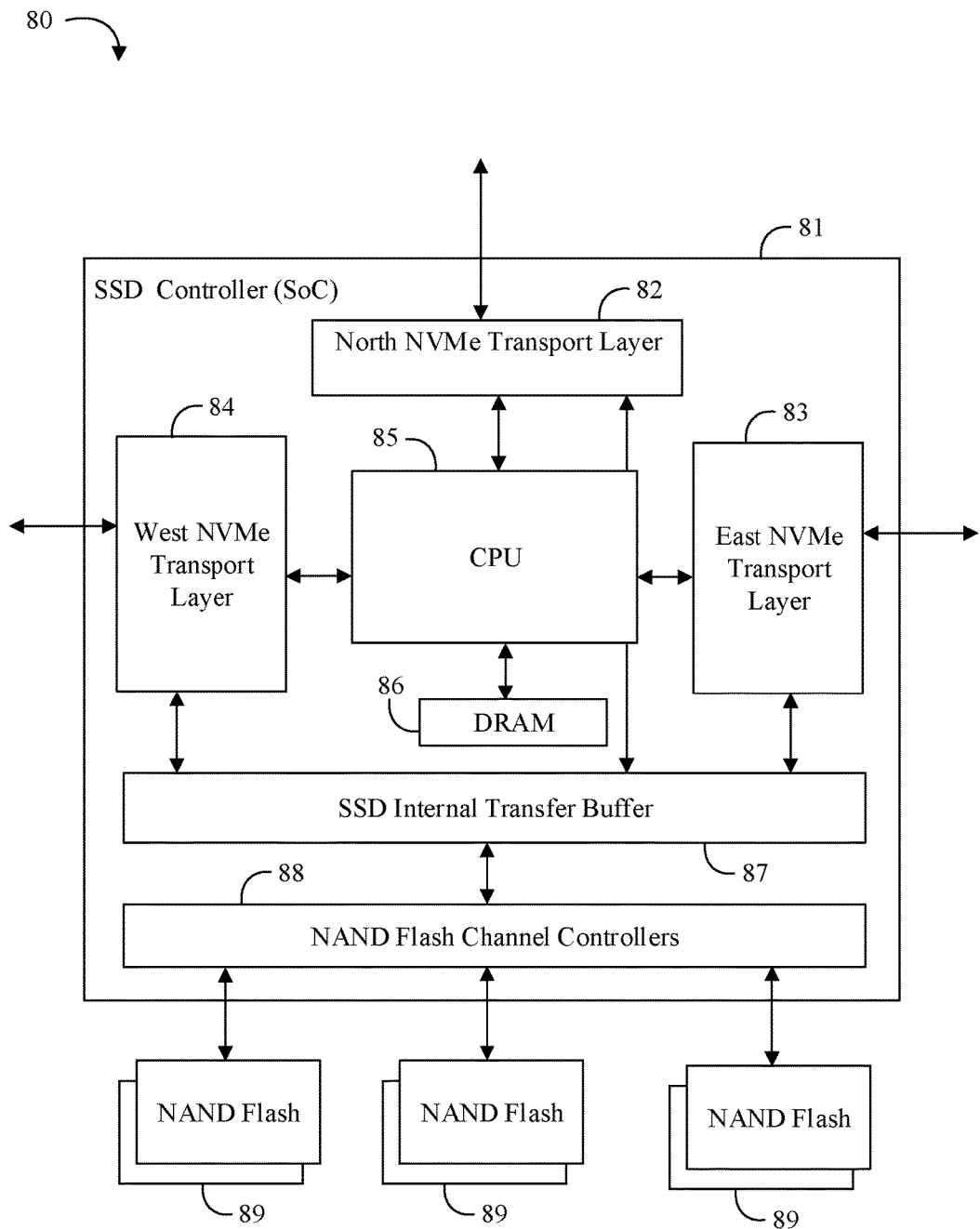
FIG. 8 is a block diagram of an example of a storage device according to an embodiment.

Turning now to FIG. 8, some embodiments may provide a storage controller implemented as a system-on-chip (SoC) device. For example, a storage device 80 may include a SSD controller 81 implemented with an SoC architecture having a storage device interconnection capability. The SSD controller 81 may include a north interface 82 including a NVMe transport layer, an east interface 83 including a NVMe transport layer, and a west interface 84 including a NVMe transport layer. For example, the north interface 82 may include a queue depth of 128, while the east interface 83 and west interface 84 each include a minimum of two queues (e.g., a submission queue (1SQ) and a completion queue (1CQ)). The SSD controller 81 may further include a CPU 85 coupled to each of the north interface 82, the east interface 83, and the west interface 84. The CPU 85 may also be coupled to DRAM 86. Each of the CPU 85, the east interface 83, and the west interface 84 may be coupled to a SSD internal transfer buffer 87 (e.g., which may be implemented with SRAM). The SSD internal transfer buffer 87 may be coupled to NAND flash channel controllers 88. One or more sets of NAND flash memory devices 89 may be coupled to the SSD controller 81 through the NAND flash channel controllers 88.

Advantageously, some embodiments of the SSD controller 81 may provide a SSD storage device 80 with interconnected data paths. Compared to other SSD devices, some embodiments may provide two more NVMe transport layers (e.g., the east interface 83 and west interface 84) that may connect the storage device 80 to peer SSDs. The NVMe transport layers of the north interface 82 may have the full NVMe functionality as needed to communicate with a switch or host device (e.g., over a suitable number of PCIe lanes). However, the east and west NVMe transport layers may be implemented using a light weight NVMe protocol, and have less queues (e.g., minimally two queues), because they do not need to communicate directly with the switch or host. The number of PCIe lanes for the east and west interfaces 83, 84 may be adjusted to a suitable value based on peer-to-peer traffic requirements (e.g., PCIe x1/x2/x4/x8/x16/etc.). The north NVMe transport layer that connects to the host may have the highest priority. The east and west NVMe transport layers may have the same priority and may be served in a round robin fashion. In other SSD devices, internal transfer buffer may be managed by the DMA engine and the CPU and is only used to transfer data between the NVMe transport layer and the NAND flash. In some embodiments, the SSD internal transfer buffer 87 may advantageously also be used to transfer data between SSD devices. In some embodiments, a routing table may be maintained in the DRAM 86 during runtime. Any updates on the routing table may also be saved to the NAND flash 89 immediately.

Turning now to FIG. 9, an example of a READ SINGLE SSD CONNECTION command may be used by the host to explore the SSD connections in an embodiment of a storage system with inter-SSD paths. The command may include a start logical block address (LBA) and an opcode corresponding to the read single SSD connection command. On a power-up, each SSD may only know that it directly connects two other SSDs, and may get their SSD IDs locally. However, all SSDs in the system may not yet have the entire SSD connection topology within the storage system. The host may broadcast this command to all the SSDs in the storage system. Each SSD may save their own connection information internally. After the host receives all command completions, the CPU may read the LBA from the SSDs to load the connection information and build the routing table.

Turning now to FIG. 10, an example of a WRITE SSD CONNECTION ROUTING TABLE command may be used by the host to write the SSD connection routing table to the SSD. The command may include a start LBA and an opcode corresponding to the write SSD connection routing table command. After the host builds the routing table, the host may write it back to the SSDs to the specific LBA. In some embodiments, the READ SINGLE SSD CONNECTION and WRITE SSD CONNECTION ROUTING TABLE commands may be system initialization commands, and may only need to be run once after a system reboot.

Turning now to FIG. 11, an example of a SSD-TO-SSD DATA MOVEMENT command may be used by the host to initiate SSD to SSD data movement. The command may include a source SSD-ID, a start LBA, and a delete flag; a target SSD-ID, and a start LBA; and a number of LBAs to transfer, and an opcode corresponding to the SSD to SSD data movement command. For example, the command may specify the source SSD-ID, the target SSD-ID, the corresponding start LBAs, and the LBA length. When the delete flag is set to one, for example, the source data may be deleted after the data transfer completes.

Some embodiments may include power loss imminent (PLI) handling for peer-to-peer data movement. For example, if a PLI indication is received, similar techniques for host data movement may be applied to the peer-to-peer data movement. All commands which have been acknowledged to the host may be completed to the media. A policy may be applied for what to do with commands which have been acknowledged to the peer but not yet acknowledged to the host to be completed or not.

In accordance with some embodiments, communication between the peers may be made with any suitable peer-to-peer physical connections. One example of a suitable physical connection may include east-west connectivity provided by a dedicated cable. For example, two ports may be provided at the front of the RSSD to connect to its east and west peers with the dedicated cable. Another example of a suitable physical connection may include an internal flex cable to provide east-west connectivity between peers. The flex cable may need to be removed prior to hot removal of the RSSD. Another example of a suitable physical connection may include east-west connectivity through a backplane.

Figure 12:
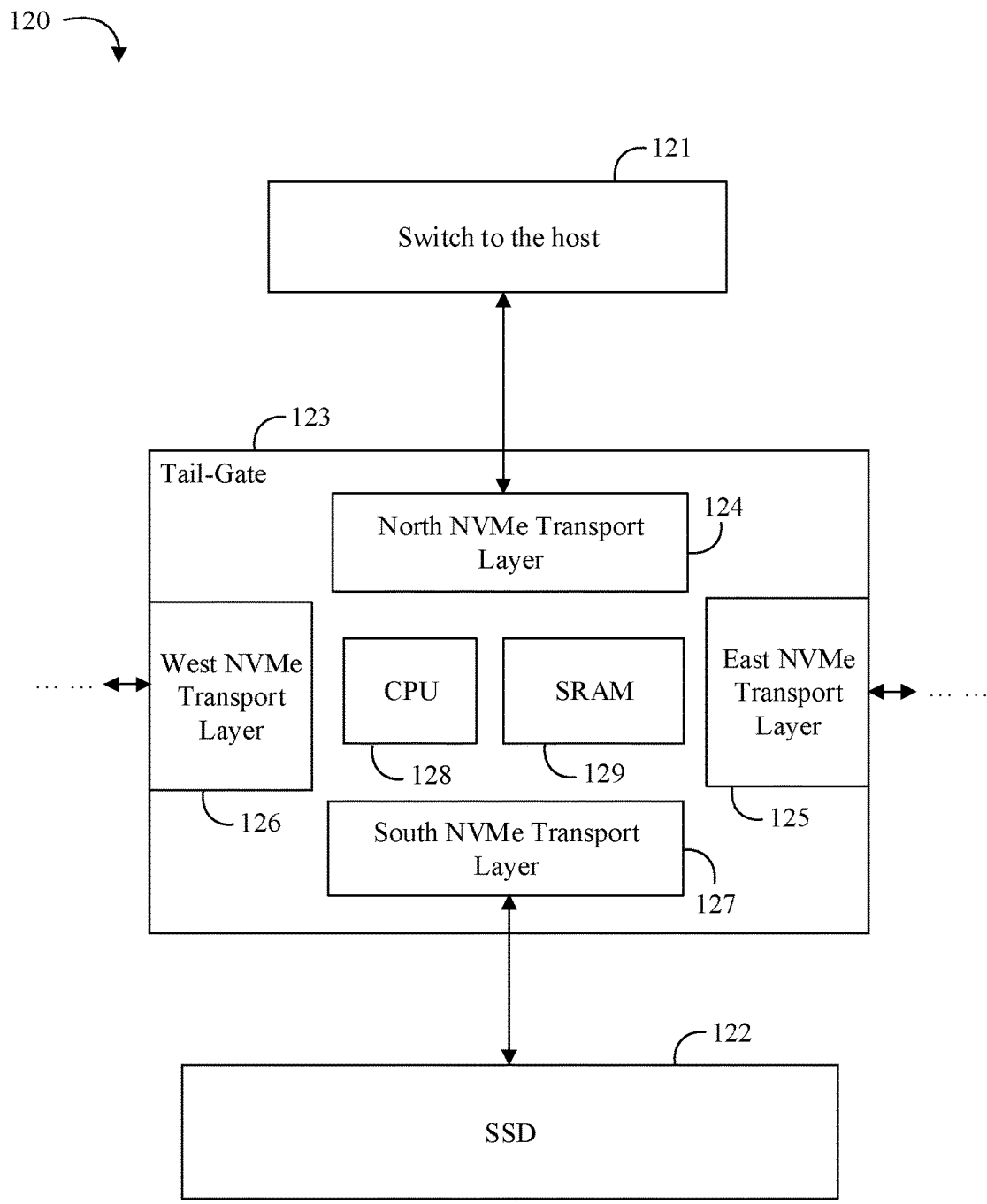
FIG. 12 is a block diagram of another example of a storage system according to an embodiment.

Turning now to FIG. 12, an embodiment of a storage system 120 may include a switch 121, a SSD device 122, and a tail-gate storage controller 123. For example, the tail-gate storage controller may advantageously provide peer-to-peer connectivity for a legacy storage device. In this example, the SSD device 122 may be a conventional SSD device with only a host interface. The tail-gate storage controller 123 may be connected to the front of a standard SSD to provide an interconnection capability without requiring a change to the existing SSD SoC architecture. For example, the tail-gate storage controller 123 may be implemented as an FPGA/ASIC that may contains four NVMe transport layers (north 124, east 125, west, 126, and a south interface 127 having an NVMe transport layer) and its own CPU 128 and memory 129 (e.g., SRAM). A routing table may be loaded to the memory 129, and the CPU 128 may control the data routing. The north NVMe transport layer 124 may connect to the host via the switch 121. The south NVMe transport layer 127 may connect to the SSD 122. The east and west NVMe transport layers 125, 126 may connect to other tail-gate storage controllers (e.g., and/or to other embodiments of storage devices that support peer-to-peer data movement).

Some embodiments may alternatively, or additionally, provide point-to-point connectivity via an additional PCIe switch. For example, some embodiments may add peer-to-peer connectivity by providing a single path to another switch in the system (e.g., housed in the back of the storage system).

Figure 13:
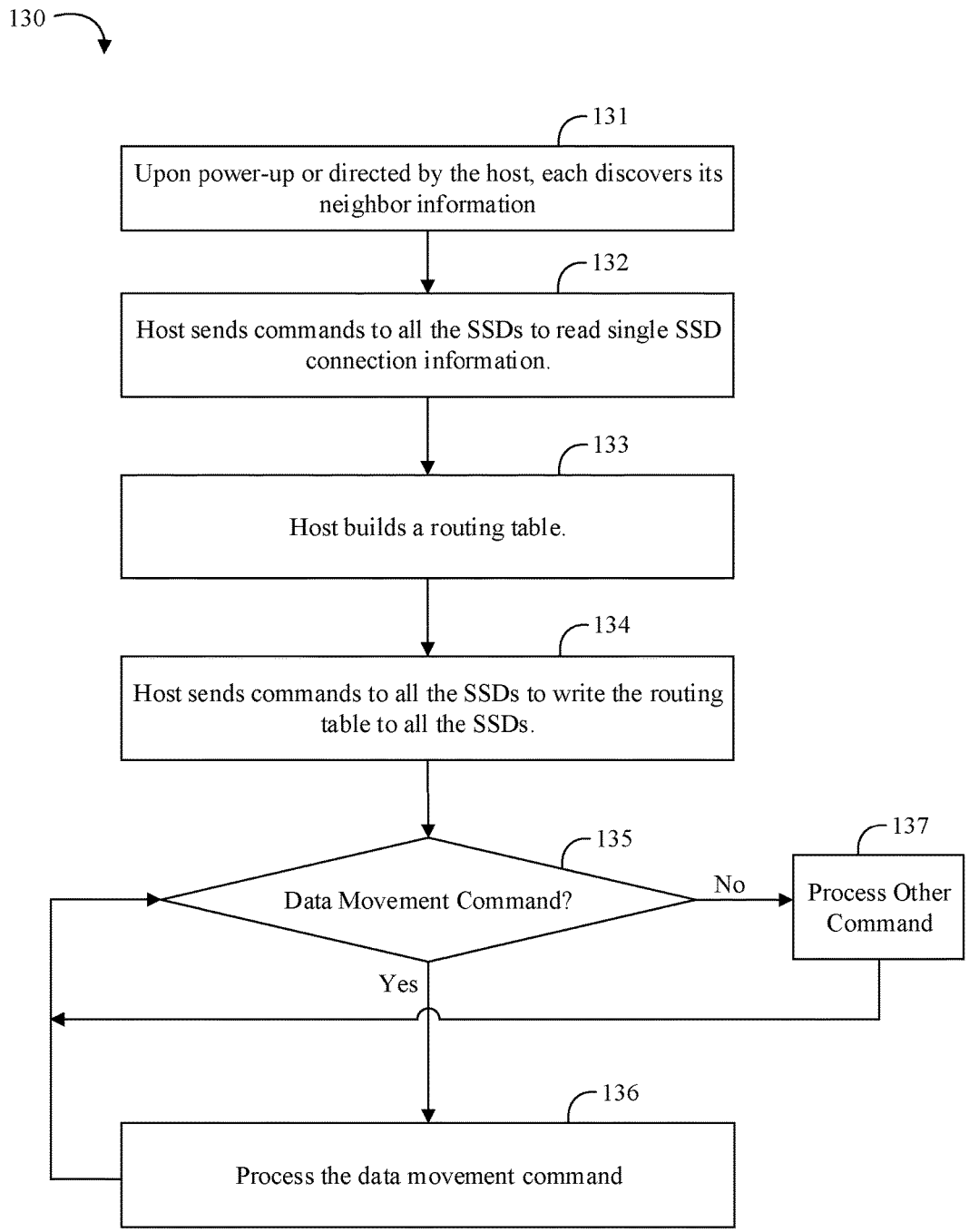
FIG. 13 is a flowchart of an example of a method of data replication within a storage system according to an embodiment.

Turning now to FIG. 13, an embodiment of a method 130 of data replication within a storage system may include discovering information of neighbor storage systems at block 131 (e.g., upon power-up, after hot plug, directed by the host, etc.). Following discovery at block 131, the host may send commands to all the SSDs to read single SSD connection information at block 132, and then the host may build a routing table based on that information at block 133. The host may then send a command to all of the SSDs to write the routing table to the SSDs internal memory at block 134. During runtime, the SSDs may determine if they receive a data movement command at block 135. If so, the SSD processes the data movement command at block 136 (e.g., without further host involvement) and the method 130 returns to block 135. Otherwise, the SSD processes the other command at block 137 and the method 130 returns to block 135.

To improve system reliability, some storage systems (e.g., such as OPENSTACK OBJECT STORAGE "SWIFT") may save redundant copies of user data. Some other systems need to load the data from a storage device (source) to the host memory first, then write the data to another storage device (target) in the system. Advantageously, some embodiment may copy the data from the source to the target directly (e.g., without using the host memory).

Turning now to FIG. 14, an illustrative example of a data movement command may be constructed as follows. During system initialization, the host sends commands (e.g., see FIG. 9) to discover each SSD's connection in the storage system, and builds the routing table (e.g., see FIG. 7). Then the host sends the routing table to each SSD in the system. A data replication request may be received as represented in FIG. 14. For example, the data movement command may indicate that 2^20 (e.g., 4 GB) of data starting at LBA 1000 of SSD-0 is requested to move to LBA 2000 of SSD-6. The host may issue the data movement command to SSD-0. After SSD-0 receives the command, it may use its routing table to determine the next SSD, which is SSD 1, and forwards the command and data to SSD-1. SSD-1 may do the same with SSD-2, and so on until the command and data arrive at SSD-6. SSD-6 may process the data movement command and replicate the data locally starting at LBA 2000.

If SSD-1 is removed from the system after system initialization, SSD-0 may update its routing table, and re-calculate the next SSD, which is SSD-31. In this case, SSD-0 may also send the new routing table to SSD-31 in addition to the command and data. When SSD-31 receives the command and data, it will forward the new routing table, command, and data to SSD-30 and so on until eventually the data will be moved to SSD-6.

Additional Notes and Examples:

Example 1 may include an electronic processing system, comprising a host device having a chassis, a first storage device communicatively coupled to the host device inside the chassis, a second storage device communicatively coupled to the host device inside the chassis, and logic communicatively coupled to the first storage device to provide a first interface between the first storage device and the host device, and provide a second interface directly between the first storage device and the second storage device.

Example 2 may include the system of Example 1, wherein the logic is further to provide a peer-to-peer interface for the second interface.

Example 3 may include the system of Example 2, wherein the logic is further to provide a third peer-to-peer interface between the first storage device and a third storage device communicatively coupled to the host device inside the chassis.

Example 4 may include the system of Example 1, wherein the logic is further to discover one or more storage devices interconnected with the first storage device, and update a local routing table for the first storage device based on the discovered interconnected storage devices.

Example 5 may include the system of Example 4, wherein the logic is further to process a data movement command to one or more of move and copy data between two or more of the interconnected storage devices.

Example 6 may include the system of any of Examples 1 to 5, wherein one or more of the storage devices includes a solid-state disk device.

Example 7 may include a semiconductor package apparatus, comprising a substrate, and logic coupled to the substrate, wherein the logic is at least partly implemented in one or more of configurable logic and fixed-functionality hardware logic, the logic coupled to the substrate to provide a first interface between a first storage device and a host device, and provide a second interface directly between the first storage device and a second storage device.

Example 8 may include the apparatus of Example 7, wherein the logic is further to provide a peer-to-peer interface for the second interface.

Example 9 may include the apparatus of Example 8, wherein the logic is further to provide a third peer-to-peer interface between the first storage device and a third storage device.

Example 10 may include the apparatus of Example 7, wherein the logic is further to discover one or more storage devices interconnected with the first storage device, and update a local routing table for the first storage device based on the discovered interconnected storage devices.

Example 11 may include the apparatus of Example 10, wherein the logic is further to process a data movement command to one or more of move and copy data between two or more of the interconnected storage devices.

Example 12 may include the apparatus of any of Examples 7 to 11, wherein one or more of the storage devices includes a solid-state disk device.

Example 13 may include a method of interconnecting storage devices, comprising providing a first interface between a first storage device and a host device, and providing a second interface directly between the first storage device and a second storage device.

Example 14 may include the method of Example 13, further comprising providing a peer-to-peer interface for the second interface.

Example 15 may include the method of Example 14, further comprising providing a third peer-to-peer interface between the first storage device and a third storage device.

Example 16 may include the method of Example 13, further comprising discovering one or more storage devices interconnected with the first storage device, and updating a local routing table for the first storage device based on the discovered interconnected storage devices.

Example 17 may include the method of Example 16, further comprising processing a data movement command to one or more of move and copy data between two or more of the interconnected storage devices.

Example 18 may include the method of any of Examples 13 to 17, wherein one or more of the storage devices includes a solid-state disk device.

Example 19 may include at least one computer readable medium, comprising a set of instructions, which when executed by a computing device, cause the computing device to provide a first interface between a first storage device and a host device, and provide a second interface directly between the first storage device and a second storage device.

Example 20 may include at least one computer readable medium of Example 19, comprising a further set of instructions, which when executed by the computing device, cause the computing device to provide a peer-to-peer interface for the second interface.

Example 21 may include at least one computer readable medium of Example 20, comprising a further set of instructions, which when executed by the computing device, cause the computing device to provide a third peer-to-peer interface between the first storage device and a third storage device.

Example 22 may include at least one computer readable medium of Example 19, comprising a further set of instructions, which when executed by the computing device, cause the computing device to discover one or more storage devices interconnected with the first storage device, and update a local routing table for the first storage device based on the discovered interconnected storage devices.

Example 23 may include at least one computer readable medium of Example 22, comprising a further set of instructions, which when executed by the computing device, cause the computing device to process a data movement command to one or more of move and copy data between two or more of the interconnected storage devices.

Example 24 may include at least one computer readable medium of any of Examples 19 to 23, wherein one or more of the storage devices includes a solid-state disk device.

Example 25 may include a storage controller apparatus, comprising means for providing a first interface between a first storage device and a host device, and means for providing a second interface directly between the first storage device and a second storage device.

Example 26 may include the apparatus of Example 25, further comprising means for providing a peer-to-peer interface for the second interface.

Example 27 may include the apparatus of Example 26, further comprising means for providing a third peer-to-peer interface between the first storage device and a third storage device.

Example 28 may include the apparatus of Example 25, further comprising means for discovering one or more storage devices interconnected with the first storage device, and means for updating a local routing table for the first storage device based on the discovered interconnected storage devices.

Example 29 may include the apparatus of Example 28, further comprising means for processing a data movement command to one or more of move and copy data between two or more of the interconnected storage devices.

Example 30 may include the apparatus of any of Examples 25 to 29, wherein one or more of the storage devices includes a solid-state disk device.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. An electronic processing system, comprising:
a host device having a chassis;
a first storage device communicatively coupled to the host device inside the chassis;
a second storage device communicatively coupled to the host device inside the chassis; and
logic communicatively coupled to the first storage device to:
provide a first interface between the first storage device and the host device,
provide a second interface directly between the first storage device and the second storage device,
identify a destination storage device that is to receive one or more of a data or a command,
determine a first path to the destination storage device, wherein the first path is to include at least one receiving storage device that is to forward the one or more of the data or the command to the destination storage device,
send the one or more of the data or the command along the first path,
identify that an acknowledgement has not been received from a non-responsive storage device of the at least one receiving storage device,
in response to the acknowledgement not being received, determine a second path to the destination storage device, wherein the second path is to omit the non-responsive storage device, and
send the one or more of the data or the command along the second path.

2. The system of claim 1, wherein the logic is further to:
provide a peer-to-peer interface for the second interface.

3. The system of claim 2, wherein the logic is further to:
provide a third peer-to-peer interface between the first storage device and a third storage device communicatively coupled to the host device inside the chassis.

4. The system of claim 1, wherein the logic is further to:
discover interconnected storage devices interconnected with the first storage device,
update a local routing table for the first storage device based on the discovered interconnected storage devices,
modify the local routing table, based on the acknowledgement not being received from the non-responsive storage device, to remove data associated with the non-responsive storage device from the local routing table, and
send the modified local routing table along the second path.

5. The system of claim 4, wherein the logic is further to:
process a data movement command to one or more of move and copy data between two or more of the interconnected storage devices.

6. The system of claim 1, wherein one or more of the first storage device, the second storage device, the destination storage device or the at least one receiving storage device includes a solid-state disk device.

7. A semiconductor package apparatus, comprising:
a substrate; and
logic coupled to the substrate, wherein the logic is at least partly implemented in one or more of configurable logic and fixed-functionality logic hardware, the logic coupled to the substrate to:
provide a first interface between a first storage device and a host device,
provide a second interface directly between the first storage device and a second storage device,
identify a destination storage device that is to receive one or more of a data or a command,
determine a first path to the destination storage device, wherein the first path is to include at least one receiving storage device that is to forward the one or more of the data or the command to the destination storage device,
send the one or more of the data or the command along the first path,
identify that an acknowledgement has not been received from a non-responsive storage device of the at least one receiving storage device,
in response to the acknowledgement not being received, determine a second path to the destination storage device, wherein the second path is to omit the non-responsive storage device, and
send the one or more of the data or the command along the second path.

8. The apparatus of claim 7, wherein the logic is further to:
provide a peer-to-peer interface for the second interface.

9. The apparatus of claim 8, wherein the logic is further to:
provide a third peer-to-peer interface between the first storage device and a third storage device.

10. The apparatus of claim 7, wherein the logic is further to:
discover interconnected storage devices interconnected with the first storage device,
update a local routing table for the first storage device based on the discovered interconnected storage devices,
modify the local routing table, based on the acknowledgement not being received from the non-responsive storage device, to remove data associated with the non-responsive storage device from the local routing table, and
send the modified local routing table along the second path.

11. The apparatus of claim 10, wherein the logic is further to: process a data movement command to one or more of move and copy data between two or more of the interconnected storage devices.

12. The apparatus of claim 7, wherein one or more of the first storage device, the second storage device, the destination storage device or the at least one receiving storage device includes a solid-state disk device.

13. A method of interconnecting storage devices, comprising:
providing a first interface between a first storage device and a host device;
providing a second interface directly between the first storage device and a second storage device;
identifying a destination storage device that is to receive one or more of a data or a command;
determining a first path to the destination storage device, wherein the first path is to include at least one receiving storage device that forwards the one or more of the data or the command to the destination storage device;
sending the one or more of the data or the command along the first path;
identifying that an acknowledgement has not been received from a non-responsive storage device of the at least one receiving storage device;
in response to the acknowledgement not being received, determining a second path to the destination storage device, wherein the second path is omits the non-responsive storage device; and
sending the one or more of the data or the command along the second path.

14. The method of claim 13, further comprising:
providing a peer-to-peer interface for the second interface.

15. The method of claim 14, further comprising:
providing a third peer-to-peer interface between the first storage device and a third storage device.

16. The method of claim 13, further comprising:
discovering interconnected storage devices interconnected with the first storage device;
updating a local routing table for the first storage device based on the discovered interconnected storage devices;
modifying the local routing table, based on the acknowledgement not being received from the non-responsive storage device, to remove data associated with the non-responsive storage device from the local routing table; and
sending the modified local routing table along the second path.

17. The method of claim 16, further comprising:
processing a data movement command to one or more of move and copy data between two or more of the interconnected storage devices.

18. The method of claim 13, wherein one or more of the first storage device, the second storage device, the destination storage device or the at least one receiving storage device includes a solid-state disk device.

19. At least one non-transitory computer readable medium, comprising a set of instructions, which when executed by a computing device, cause the computing device to:
provide a first interface between a first storage device and a host device;
provide a second interface directly between the first storage device and a second storage device;

identify a destination storage device that is to receive one or more of a data or a command;

determine a first path to the destination storage device, wherein the first path is to include at least one receiving storage device that is to forward the one or more of the data or the command to the destination storage device;

send the one or more of the data or the command along the first path;

identify that an acknowledgement has not been received from a non-responsive storage device of the at least one receiving storage device;

in response to the acknowledgement not being received, determine a second path to the destination storage device, wherein the second path is to omit the non-responsive storage device; and send the one or more of the data or the command along the second path.

20. The at least one non-transitory computer readable medium of claim 19, comprising a further set of instructions, which when executed by the computing device, cause the computing device to:

provide a peer-to-peer interface for the second interface.

21. The at least one non-transitory computer readable medium of claim 20, comprising a further set of instructions, which when executed by the computing device, cause the computing device to:

provide a third peer-to-peer interface between the first storage device and a third storage device.

22. The at least one non-transitory computer readable medium of claim 19, comprising a further set of instructions, which when executed by the computing device, cause the computing device to:

discover interconnected storage devices interconnected with the first storage device; and update a local routing table for the first storage device based on the discovered interconnected storage devices;

modify the local routing table, based on the acknowledgement not being received from the non-responsive storage device, to remove data associated with the non-responsive storage device from the local routing table; and send the modified local routing table along the second path.

23. The at least one non-transitory computer readable medium of claim 22, comprising a further set of instructions, which when executed by the computing device, cause the computing device to:

process a data movement command to one or more of move and copy data between two or more of the interconnected storage devices.

24. The at least one non-transitory computer readable medium of claim 19, wherein one or more of the first storage device, the second storage device, the destination storage device or the at least one receiving storage device includes a solid-state disk device.

* * * * *